United States Patent [19]

Spanjer

[11] Patent Number: 4,627,988
[45] Date of Patent: Dec. 9, 1986

[54] METHOD FOR APPLYING MATERIAL TO A SEMICONDUCTOR WAFER

[75] Inventor: Keith G. Spanjer, Scottsdale, Ariz.

[73] Assignee: Motorola Inc., Schaumburg, Ill.

[21] Appl. No.: 759,792

[22] Filed: Jul. 29, 1985

[51] Int. Cl.⁴ ......................................... H01L 21/312
[52] U.S. Cl. ...................................... 427/5; 430/308; 430/330; 427/82
[58] Field of Search ...................... 427/5, 82; 430/308, 430/330

[56] References Cited

U.S. PATENT DOCUMENTS

| | | | |
|---|---|---|---|
| 3,425,831 | 2/1969 | Poole | 430/308 |
| 3,507,654 | 4/1970 | Wrench | 430/308 |
| 4,246,147 | 1/1981 | Bakas | 427/259 |
| 4,362,808 | 12/1982 | Otthofer | 430/308 |

Primary Examiner—John D. Smith
Attorney, Agent, or Firm—Jonathan P. Meyer; Raymond J. Warren

[57] ABSTRACT

Passivation, alpha protection and other relatively thick, patterned layers are applied to semiconductor wafers by a screen printing method. Patterned emulsions carried on fine mesh stainless steel screens are tempered at elevated temperatures to harden the emulsion. The screens so prepared withstand many cycles of printing and cleaning with harsh solvents present in screenable polymers such as polyimide and rigid silicone.

15 Claims, 4 Drawing Figures

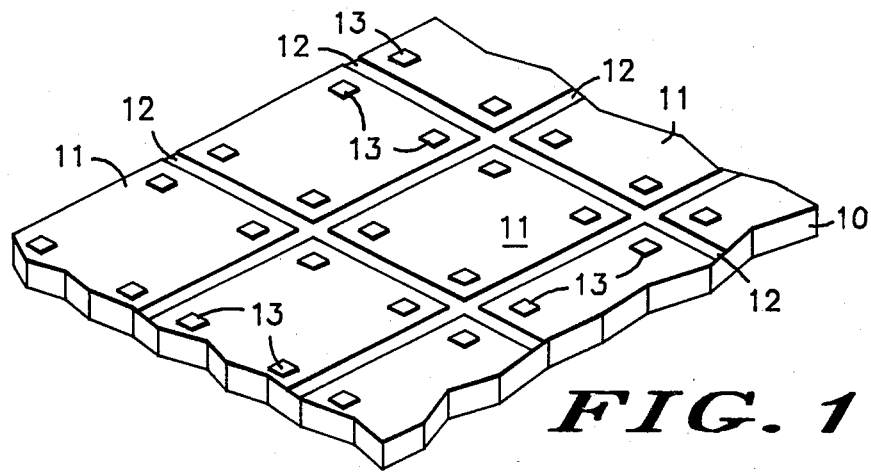
FIG. 1
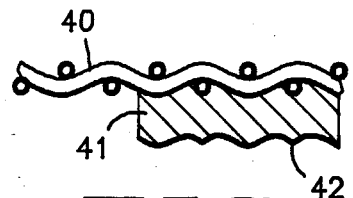
FIG. 3
FIG. 4
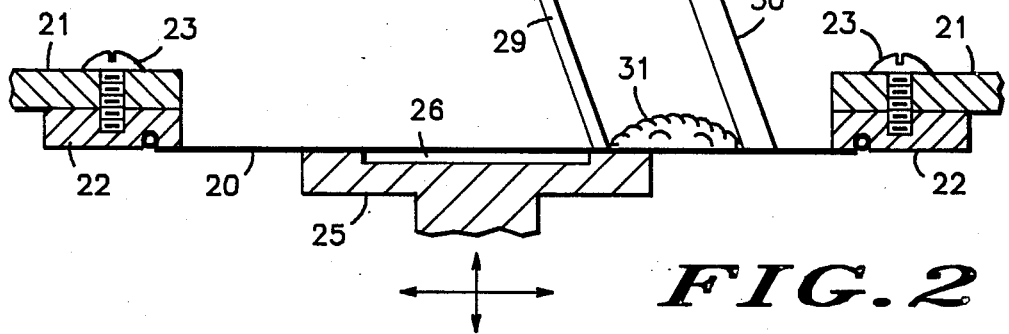
FIG. 2

METHOD FOR APPLYING MATERIAL TO A SEMICONDUCTOR WAFER

FIELD OF THE INVENTION

The present invention relates, in general, to a method for applying a viscous material in a patterned fashion to a semiconductor wafer. More particularly, the invention relates to an improved method of screen printing passivation, alpha protection or other materials onto semiconductor wafers.

BACKGROUND OF THE INVENTION

In the manufacture of semiconductor devices, it almost universally necessary to apply a layer of some type of material overlying the entire device, excluding the bonding pads. In high density memory devices, it is often necessary to apply a layer of alpha particle protection material. In mesa type devices it is necessary to passivate the exposed junctions at the edges of the mesa structure. In nearly all semiconductor devices, it is necessary to apply a passivation layer to electrically and mechanically protect the circuit.

Prior art solutions to the problem of applying passivation and other materials to semiconductor devices the many and varied. Edge passivation of mesa type devices is typically accomplished by the application of a photosensitive mixture which includes small glass particles. The material is patterned using conventional photolithography and a combination of baking and firing steps transform the remaining material to a passivating glass. Application of alpha particle protection and passivation materials is commonly accomplished by spinning on a liquid which is then dried or cured in some fashion to produce the desired layer. Spin on techniques are commonly limited to a few tens of thousands of Angstroms in the thickness of the layer of material which may be applied. Thicknesses in this range are commonly unacceptable for alpha protection purposes. In addition, a spun on layer must be subjected to some type of patterning to open the passivation or alpha protection material over the bonding pads.

Recently, screen printing mechanisms have come into use in the electronics industry and have been applied to printed circuit board, liquid crystal display and other coating processes. Typically, a photosensitive emulsion supported on a stainless steel mesh is patterned to protect areas of the surface being printed which are not to receive a coating of the printed material. The mask is then aligned over the board, display or other product and the material to be applied is forced through the mesh where the photosensitive emulsion has been removed. It is possible, using such a technique, to apply layer having a thickness of several mils.

A screen printing approach would be desirable for the application of passivation and other coatings to semiconductor wafers. However, it has been found that the photosensitive emulsion, even after having been developed and fixed, does not resist the solvents used in certain desirable passivation and alpha protection materials. Thus, a screen used in such a printing process must be replaced very frequently. Up to now, attempts to improve the longevity of screens used for the application of passivation and alpha protection materials to semiconductor wafers have not been successful.

SUMMARY OF THE INVENTION

Accordingly, it is an object of the present invention to provide an improved method for applying material to a semiconductor wafer.

It is a further object of the present invention to provide an improved method for screen printing of passivation, alpha protection and other layers on to semiconductor wafers. Yet a further object of the present invention is to provide for the improved longevity of screens used in the screen printing of passivation, alpha protection and other layers onto semiconductor wafers.

These and other objects and advantages of the present invention are provided by patterning a photosensitive emulsion carried on a screen, tempering the patterned emulsion at an elevated temperature for a prolonged period and screen printing a material onto a semiconductor wafer using the tempered screen.

These and other objects and advantages of the present invention will be apparent to one skilled in the art from the detailed description below taken together with the drawings.

BRIEF DESCRIPTION OF THE DRAWINGS

FIG. 1 is a perspective view of a portion of a semiconductor wafer;

FIG. 2 is a simplified cross sectional view of a screen printing apparatus suitable for use in practicing the present invention;

FIG. 3 is an enlarged cross sectional view illustrating a patterned screen suitable for use in practicing the present invention; and FIG. 4 is a flow diagram illustrating the steps in preparing a screen suitable for use in practicing the present invention.

DETAILED DESCRIPTION OF THE INVENTION

FIG. 1 is a perspective view of a portion of a typical semiconductor wafer 10. The stage at which a passivation or an alpha protection layer is commonly applied immediately follows the steps which produce the metallization pattern on the front side of the devices. This is immediately prior to the stage at which wafer 10 is back-lapped to reduce its final thickness and any necessary metallization is applied to the back surface. On the front side of wafer 10 a plurality of individual die 11 are separated by scribe grids 12. Each die 11, in addition to a number of other structures not pertinent to the present invention, includes a plurality of bonding pads 13 to which electrical contact must be made during the process of packaging die 11.

The application of a passivation coating to wafer 10 requires that a continuous, electrically insulating film be applied to the surface of wafer 10. Preferably, this layer will cover all of wafer 10 except for bonding pads 13. Of primary importance in any method for applying a passivation coating is the cost of implementing such a process in a high volume manufacturing environment.

A passivation coating may sometimes be relatively thin and still be effective. However, a coating which is to be used to protect the circuits from alpha particles must be thick enough to present a substantial effective cross section to such particles. Depending on the particular material chosen for the alpha protection layer, this may require several mils thickness. In addition, edge passivation of mesa-type devices requires a similar layer of material.

Materials which are suitable for passivation and alpha protection layers include polyimides and rigid silicones. However, screenable forms of these materials include solvents which attack the developed and fixed photoresist which defines the screen pattern. The resulting short useful life of the screen has made screen printing of these materials an uneconomical alternative to other methods of applying materials to semiconductor wafers. It has been found that, through the use of the techniques disclosed below, these materials may be applied in relatively thick, patterned layers suitable for use as passivation and or alpha protection coatings on semiconductor wafers.

FIG. 2 is a simplified cross sectional view of a commercial screen printing apparatus which may be used to practice the present invention. An example of such an apparatus which is suitable for use with the present invention is the model LS-15TV available from Newlong of Japan. A screen printing apparatus suitable for use with the present invention must have the basic components of any screen printing apparatus, that is, a means for mounting a patterned screen, a means for bringing an article to be printed into registration with the pattern on the screen and a means for forcing material through the screen onto the article to be printed. In addition, to be suitable for use with the present invention, a screen printing apparatus must be capable of repeatedly positioning the article to be printed in registration with the pattern on the screen to within a resolution of approximately 10 microns.

In the simplified view of FIG. 2 the means for mounting screen 20 comprises a fixture 21 to which frame 22 of screen 20 is removeably affixed by means of screws 23 or the like.

A wafer holder 25 has a recess 26 adapted to hold a semiconductor wafer of a predetermined size. Holder 25 is movable in both the horizontal and vertical directions to provide for the loading and unloading of wafers and for the registration of the wafers with the pattern on screen 20.

The apparatus used to force the material through screen 20 onto the wafer comprises a blade carrier 28 which is movable in both the horizontal and vertical directions, a doctor blade 29 affixed to blade carrier 28 and a squeegee blade 30 also affixed to blade carrier 28. Doctor blade 29 is typically a relatively stiff blade which is used to scrape excess material from the surface of screen 20. Squeegee blade 30 is a somewhat more flexible blade which is used to force the material through screen 20.

In operation, a wafer is loaded, either manually or by an automated system, into recess 26 of wafer holder 25. At this time, wafer holder 25 is in a position away from screen 20. Wafer holder 25 then moves to bring the wafer into registration with the pattern on screen 20. It has been found that a spacing of approximately 0.030 inches between the upper surface of the wafer and the lower surface of screen 20 is advantageous. This allows squeegee blade 30 to depress screen 20 into contact with the upper surface of the wafer during printing.

A charge 31 of material to be printed on to the surface of the wafer is deposited on the upper surface of screen 20 between doctor blade 29 and squeegee blade 30. Again, this may be accomplished either manually or by means of an automated mechanism. The material is in a liquid, but highly viscous form. The viscosity of the material may advantageously be in the range of 250,000 to 350,000 centipoises.

Materials suitable for the purposes of the present invention may be referred to generally as screenable polymers. Polyimides and rigid silicones are particular examples which may be advantageous for passivation and/or alpha protection of semiconductor devices. Such materials are available in screenable form from suppliers such as the DuPont Chemical Company, among others. No preparation of these materials is necessary prior to their use as described above.

Once charge 31 of the screenable material is deposited on screen 20 between doctor blade 29 and squeegee blade 30, blade holder 28 is lowered to place a predetermined amount of pressure on screen 20 with squeegee blade 30. The amount of pressure necessary for forcing the screenable material through screen 20 onto the wafer must be determined on a case-by-case basis. Too little pressure will not force sufficient material through screen 20 to completely fill the desired spaces on the wafer. Too much pressure will tend to force the material between the wafer and the emulsion on screen 20 which defines those areas which are not intended to be covered with material, thus decreasing the resolution of the pattern.

Blade holder 28 is then moved across screen 20 so that the material is forced ahead of squeegee blade 30 through the pattern on screen 20 and onto the wafer in recess 26 of holder 25. Once blade holder 28 has passed over the entirety of the wafer, the pressure is released slightly, while maintaining contact between doctor blade 29 and screen 20 and blade holder 28 is moved back to its original position. Doctor blade 29 serves on the backstroke to scrape excess material from the surface of screen 20 so that it may be used on the next pass. Typically, only a single pass is necessary to print each wafer. However, charge 31 of the screenable material is typically sufficient to print several wafers.

At this point, wafer holder 25 is cycled out from under screen 20 so that the just printed wafer may be removed and a new wafer inserted and the cycle begun again.

The foregoing brief description of the structure and operation of a screen printer suitable for use with the present invention is by way of example only. Numerous structural and operational details will be different from those described when using any particular apparatus.

FIG. 3 is an enlarged cross-sectional view of a portion of a patterned screen useful in the practice of the present invention. Screen 40 comprises comprises a uniform mesh of stainless steel wires. Such stainless steel meshes are widely available. Stainless steel meshes are identified by a mesh number, which specifies the size of the individual stainless steel wires and the spacing thereof. A stainless steel mesh with a mesh specified as 200 mesh has been found suitable for use in the present invention.

On the bottom side of mesh 40, where it will come into contact with the wafer being printed, is a patterned emulsion 41. Emulsion 41 defines those areas of the wafer which will not receive the passivating, alpha protection or other material. Lower surface 42 of emulsion 41 is forced into contact with the upper surface of the wafer by the pressure of squeegee blade 30 (see FIG. 2). In a particular embodiment of the present invention an emulsion having a thickness of approximately 2 mils was used in combination with a screen having a thickness of approximately 1.5 mils. In this case, as is shown in FIG. 3, lower surface 42 of emulsion 41 is somewhat contoured, reflecting the underlying shape of screen 40. In some cases, this contouring of surface 42 of emulsion 41 may allow leakage of the screened material into undesired areas. If this is the case, it has been found possible to apply standard surface finishing techniques to polish surface 42 of emulsion 41 to a flat surface.

As will be apparent, the combined thickness of screen 40 and emulsion 41 will determine, approximately, the thickness of the layer of material, before curing, applied to the wafer. Therefore, choice of the screen mesh size and the thickness of emulsion layer 41 allows some control over the thickness of the final passivation and/or alpha protection layer.

FIG. 4 is a flow chart illustrating the steps used to prepare a patterned screen for use with the present invention. First, a mesh which has been stretched over and fixed to a screen frame is coated on the bottom side with a liquid emulsion. Typically, a polyvinylalcohol emulsion is used. These emulsions are sensitive to ultraviolet light. Next, the emulsion is exposed to ultraviolet light through a mask which defines the pattern of areas to be covered with the eventual passivation, alpha protection, or other coating. Next, the exposed emulsion is developed using a conventional developer appropriate for the particular emulsion chosen. Next, the patterned emulsion is cured, once using again using exposure to ultraviolet light to further cross-link, or polymerize, the chemical components of the emulsion.

Up to this point in the process, the preparation of the patterned screen is similar to that practiced in the prior art. However, it has been found that a screen prepared according to these prior art techniques will not withstand the solvents present in the screenable polymers which are useful for passivation and alpha protection of semiconductor wafers. Such solvents include N methyl 2 pyrrolidone and xylene. Screens available commercially from vendors such as Microscreen Precision Products of South Bend, Ind. are prepared according to these prior art techniques and will withstand only a few cycles of printing and cleaning. This renders the application of passivation and alpha protection layers to semiconductor wafers using these screens uneconomical. In addition, the suggested method for improving the stability of the emulsion, which is to lengthen the UV cure step, is not effective to harden the emulsion against such strong solvents.

The final step in the screen preparation process according to the principles of the present invention is to temper the screen after the UV cure step by baking in an oven at approximately 100° C. for approximately 4 hours. The atmosphere in the oven is air. Screens prepared according to this method have withstood many hundreds of cycles of printing and cleaning with the above mentioned solvents without significant degradation of the emulsion pattern.

It should be noted that one final step in the overall process of the present invention remains to be described. That is, after screening on the passivation and/or alpha protection coating, it must commonly be cured to drive off the volatile solvents and otherwise stabilize the layer. This is typically performed in one of a convection oven, a vacuum oven or a broadband infra-red radiation chamber. The latter is the preferred method. As is the common practice when curing materials such as polyimide or silicone, a test capacitor comprising a layer of uncured material between two electrodes is inserted in the curing chamber along with the wafers. The cure is considered to be complete when the capacitance of this test structure drops below a predetermined point.

A method and apparatus have been described which are suitable for the economical application of passivation, alpha protection and other layers to semiconductor wafers. The disclosed method is capable of depositing layers thick enough to act as the edge passivation layer on mesa-type devices having exposed junctions. The screens produced by the disclosed process have been shown to survive hundreds of cycles of printing and cleaning including exposure to solvent which destroy prior art screens.

While the present invention has been described with reference to a particular embodiment thereof, various modifications and changes thereto will be apparent to one skilled in the art and are within the spirit and scope thereof.

I claim:

1. A method of applying material containing a solvent damaging to a photosensitive emulsion to a semiconductor wafer comprising the steps of:
   applying said photosensitive emulsion to a screen;
   patterning said photosensitive emulsion;
   tempering said patterned photosensitive emulsion at an elevated temperature for a prolonged period; and
   applying said material to said wafer through said screen.

2. The method according to claim 1 wherein said material is a screenable polymer.

3. The method according to claim 1 wherein a layer of material having a thickness greater than approximately 1 mil is applied.

4. The method according to claim 1 wherein said photosensitive emulsion is a polyvinylalcohol.

5. The method according to claim 1 wherein said step of tempering further comprises the step of:
   exposing said screen to a temperature of approximately 100° C. in an atmosphere of air for approximately 4 hours.

6. A method of passivating a plurality of semiconductor devices on a wafer utilizing a screenable passivating material containing a solvent damaging to a photosensitive emulsion comprising the steps of:
   applying said photosensitive emulsion to a screen;
   patterning said photosensitive emulsion;
   tempering said photosensitive emulsion at an elevated temperature for a pronlonged period;
   aligning said wafer with said patterned emulsion on said screen;
   forcing said screeneable passivating material through said screen onto said wafer; and
   curing said material on said wafer.

7. The method according to claim 6 wherein said devices are mesa-type devices and said passivating material passivates exposed junctions thereon.

8. The method according to claim 6 wherein said passivating material is a screenable polymer.

9. The method according to claim 6 wherein said passivating material is a screenable polymer.

10. The method according to claim 6 wherein said photosensitive emulsion is a polyvinylalcohol.

11. The method according to claim 6 wherein said step of tempering further comprises the steps of:
    exposing said screen to a temperature of approximately 100° C. in an atmosphere of air for approximately 4 hours.

12. A method of applying a screenable aplha particle protection material contining a solvent damaging to a photosensitive emulsion comprising the steps of:
   applying said photosensitive emulsion to a screen;
   patterning said photosensitive emulsion;
   tempering said screen at an elevated temperature for a prolonged period;
   aligning said wafer with said patterned emulsion on said screen;
   forcing said screenable alpha particle protection material through said screen onto said wafer; and
   curing said material on said wafer.

13. The method according to claim 12 wherein said screenable alpha protection material is a screenable polymer.

14. The method according to claim 12 wherein said material on said wafer is greater than approximately 1 mil thick.

15. The method according to claim 12 wherein said step of tempering further comprises the step of:
   exposing said screen to a temperature of approximately 100° C. in an atmosphere of air for approximately 4 hours.

* * * * *